United States Patent
Vandroux et al.

(10) Patent No.: US 10,910,782 B2
(45) Date of Patent: Feb. 2, 2021

(54) TREATMENT, BEFORE THE BONDING OF A MIXED CU-OXIDE SURFACE, BY A PLASMA CONTAINING NITROGEN AND HYDROGEN

(75) Inventors: Laurent Vandroux, Le Cheylas (FR); Léa Di Cioccio, Saint Ismier (FR); Pierric Gueguen, Echirolles (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 570 days.

(21) Appl. No.: 13/818,864

(22) PCT Filed: Aug. 31, 2011

(86) PCT No.: PCT/FR2011/000484
§ 371 (c)(1),
(2), (4) Date: Feb. 25, 2013

(87) PCT Pub. No.: WO2012/028793
PCT Pub. Date: Mar. 8, 2012

(65) Prior Publication Data
US 2013/0153093 A1 Jun. 20, 2013

(30) Foreign Application Priority Data
Aug. 31, 2010 (FR) .................... 10 03496

(51) Int. Cl.
*H01R 43/02* (2006.01)
*H01L 21/02* (2006.01)
(Continued)

(52) U.S. Cl.
CPC ....... *H01R 43/02* (2013.01); *H01L 21/02068* (2013.01); *H01L 21/02074* (2013.01);
(Continued)

(58) Field of Classification Search
None
See application file for complete search history.

(56) References Cited

U.S. PATENT DOCUMENTS

| 4,612,083 | A | | 9/1986 | Yasumoto et al. |
| 5,503,704 | A | * | 4/1996 | Bower ........... C04B 37/001 156/272.6 |

(Continued)

FOREIGN PATENT DOCUMENTS

CN 101295654 A 10/2008

OTHER PUBLICATIONS

Z. Q. Liu, W. J. Wang, T. M Wang, S. Chao, S. K. Zheng. "Thermal stability of copper nitride films prepared by rf magnetron sputtering." Thin Solid Films 325 (1998) 55-59.*

(Continued)

*Primary Examiner* — Paul A Wartalowicz
*Assistant Examiner* — Stephani Hill
(74) *Attorney, Agent, or Firm* — Oliff PLC

(57) ABSTRACT

A method for bonding a first surface provided with at least one copper area surrounded by a silicon oxide area to a second surface includes an operation of treatment of the first surface by a plasma, before placing the first surface in contact with the second surface. The plasma is formed from a gas source containing a silicon oxide nitriding agent and a copper oxide reducing agent containing hydrogen. The gas source may include an $N_2$ and $NH_3$ and/or $H_2$ gas mixture or a $N_2O$ and $H_2$ gas mixture, or ammonia, which is then used both as a nitriding agent and as a reducing agent. The plasma obtained from this gas source then necessarily contains nitrogen and hydrogen, which enables, in a single operation, to provide a high-performance bonding between the first and second surfaces.

13 Claims, 1 Drawing Sheet

(51) Int. Cl.
*H01L 25/00* (2006.01)
*H01L 23/00* (2006.01)
*H01L 21/20* (2006.01)
*H01L 21/18* (2006.01)

(52) U.S. Cl.
CPC ........ *H01L 21/185* (2013.01); *H01L 21/2007* (2013.01); *H01L 24/05* (2013.01); *H01L 24/08* (2013.01); *H01L 24/80* (2013.01); *H01L 25/50* (2013.01); *C09J 2301/416* (2020.08); *C09J 2400/163* (2013.01); *H01L 2224/0381* (2013.01); *H01L 2224/0401* (2013.01); *H01L 2224/05546* (2013.01); *H01L 2224/05571* (2013.01); *H01L 2224/05576* (2013.01); *H01L 2224/05647* (2013.01); *H01L 2224/05687* (2013.01); *H01L 2224/05688* (2013.01); *H01L 2224/08121* (2013.01); *H01L 2224/08145* (2013.01); *H01L 2224/13099* (2013.01); *H01L 2224/8002* (2013.01); *H01L 2224/80012* (2013.01); *H01L 2224/80013* (2013.01); *H01L 2224/80097* (2013.01); *H01L 2224/80357* (2013.01); *H01L 2224/80895* (2013.01); *H01L 2224/80896* (2013.01); *H01L 2224/80905* (2013.01); *H01L 2224/94* (2013.01); *H01L 2924/00014* (2013.01); *H01L 2924/01023* (2013.01); *H01L 2924/01029* (2013.01); *H01L 2924/01058* (2013.01); *H01L 2924/01079* (2013.01)

(56) References Cited

U.S. PATENT DOCUMENTS

| | | | |
|---|---|---|---|
| 6,080,640 A | 6/2000 | Gardner et al. | |
| 6,472,755 B1 | 10/2002 | Ngo et al. | |
| 7,079,370 B2 * | 7/2006 | Dong | B08B 7/00 361/230 |
| 7,094,705 B2 * | 8/2006 | Lin | H01L 21/321 257/E21.3 |
| 2004/0157407 A1 * | 8/2004 | Tong | B23K 20/02 438/455 |
| 2006/0024864 A1 * | 2/2006 | Nakanishi | H01L 21/02046 438/107 |
| 2007/0071900 A1 * | 3/2007 | Soussan | B23K 1/206 427/372.2 |
| 2007/0111386 A1 | 5/2007 | Kim et al. | |
| 2008/0268573 A1 | 10/2008 | Liu et al. | |
| 2009/0286382 A1 * | 11/2009 | Huff | H01L 24/83 438/455 |
| 2011/0011531 A1 * | 1/2011 | Schulte | H01L 24/11 156/281 |
| 2011/0129986 A1 * | 6/2011 | Libralesso | H01L 21/2007 438/455 |

OTHER PUBLICATIONS

He et al. "Combined Surface Activated Bonding Technique for Low-Temperature Cu/Dielectric Hybrid Bonding." 2016 ECS J. Solid State Sci. Technol. 5 p. 419-p. 424. (Year: 2016).*
Mar. 17, 2015 Office Action issued in Chinese Patent Application No. 201180051602.4.
Di Cioccio et al; "Enabling 3D Interconnects with Metal Direct Bonding;" 2009 IEEE International Interconnect Technology Conference—IITC; Jun. 1, 2009-Jun. 3, 2009; XP002634230; ISBN: 978-1-4244-4492-2; pp. 152-154.

* cited by examiner

TREATMENT, BEFORE THE BONDING OF A MIXED CU-OXIDE SURFACE, BY A PLASMA CONTAINING NITROGEN AND HYDROGEN

BACKGROUND OF THE INVENTION

The present invention relates to a method for bonding a first surface provided with at least one copper area surrounded by a silicon oxide area to a second surface.

STATE OF THE ART

Molecular bonding or direct bonding is based on the placing in direct contact of two surfaces, without using a specific material such as glue, wax, a metal of low melting temperature, etc. The surfaces intended to be placed into contact may be hydrophilic or hydrophobic.

A hydrophobic surface may for example be an exposed surface of a silicon wafer (or substrate) free of silicon oxide, while a hydrophilic surface may for example be an exposed surface of a silicon wafer comprising a thin silicon oxide layer.

The molecular bonding method further requires that the surfaces intended to be bonded are sufficiently smooth, free of particles or of contamination, that they have an adapted surface chemistry and are sufficiently close to initiate a contact. In this case, attractive forces between the two surfaces are strong enough to cause the molecular bonding.

Bondings are generally performed at ambient temperature and at ambient pressure, after a chemical cleaning of the surfaces. However, a subsequent thermal treatment, for example, at a temperature on the order of 1,000° C., is often carried out to reinforce bonding energies. Now, in a very large number of applications, thermal treatment steps at such a temperature are not allowed.

Bonding methods requiring no thermal treatments at such a high temperature, after the placing into contact of the surfaces to be bonded, have already been provided. They generally comprise a surface activation step prior to the placing into contact, which enables to limit the thermal bonding consolidation treatment between 200 and 400° C.

The bonding method may in particular be used to form three-dimensional substrate interconnects, to miniaturize electronic components. In this case, the surfaces to be bonded generally comprise copper areas intended to be placed into contact with one another to provide an electric contact. Such copper areas are further generally surrounded by silicon oxide areas ensuring the electric insulation between several areas of a same substrate and the bonding between surfaces. Such surfaces are more specifically called heterogeneous (or mixed) Cu-oxide surfaces.

At the placing into contact, a shift, which may be minute, inevitably occurs between the respective copper areas of the surfaces to be bonded. With this shift, three types of interfaces are then involved in the bonding:

an interface between the copper of one surface and the silicon oxide of another surface ($Cu$-$SiO_2$ interface)

an interface between the copper of one surface and the copper of the other surface (Cu-Cu interface)

and an interface between the silicon oxide of one surface and the silicon oxide of the other surface ($SiO_2$-$SiO_2$ interface).

To obtain a good bonding and a good electric performance, a specific treatment must be performed for each type of interface:

it is necessary to form a barrier at the level of the $Cu$/$SiO_2$ interface, to block the copper diffusion from the copper area of the second surface to the silicon oxide area of the first surface, at the level of the $SiO_2$-$SiO_2$ interface, the silicon oxide must be activated for a good bonding, at the Cu-Cu interface, it is necessary to remove the copper oxide which naturally forms at the level of the copper area of each surface to be bonded, to improve the electric performance of the component.

Now, the issues corresponding to these different interfaces are up to now addressed independently from one another.

Further, given the heterogeneity of a mixed Cu-oxide surface, there also are issues due to the different types of encountered interfaces when such a mixed surface is directly bonded to another surface, such as an exposed surface of a continuous silicon oxide or metal or semiconductor material layer.

SUMMARY OF THE INVENTION

The object of the present invention is to provide a unique solution, easy to implement and economically viable, to achieve a high-quality bonding between a first surface provided with at least one copper area surrounded by a silicon oxide area and a second surface.

According to the present invention, this aim is achieved by a method for bonding a first surface provided with at least one copper area surrounded by a silicon oxide area to a second surface, characterized in that before the first and second surfaces are placed into contact, the first surface is submitted to a plasma treatment operation, said plasma being formed from a gas source containing a silicon oxide nitriding agent and a copper oxide reducing agent containing hydrogen.

According to a first development of the present invention, the nitriding agent is dinitrogen and the reducing agent is selected from among ammonia and dihydrogen.

According to a second development of the present invention, the nitriding agent is nitrous oxide and the reducing agent is dihydrogen.

According to a third development of the present invention, the reducing agent is ammonia, and it forms the nitriding agent.

According to a specific embodiment, the second surface being provided with at least one copper area surrounded by a silicon oxide area, it is also submitted, before the placing into contact, to a plasma treatment operation, said plasma being formed from a gas source containing a silicon oxide nitriding agent and a hydrogen-based copper oxide reducing agent.

BRIEF DESCRIPTION OF THE DRAWINGS

Other advantages and features will become more clearly apparent from the following description of particular embodiments of the invention given for non-restrictive example purposes only and represented in the appended drawings, in which.

DESCRIPTION OF PARTICULAR EMBODIMENTS

A particular embodiment for bonding two heterogeneous Cu-oxide surfaces 1 and 1' respectively belonging to substrates 2 and 2' is illustrated in FIGS. 1 to 4.

Figure 1:
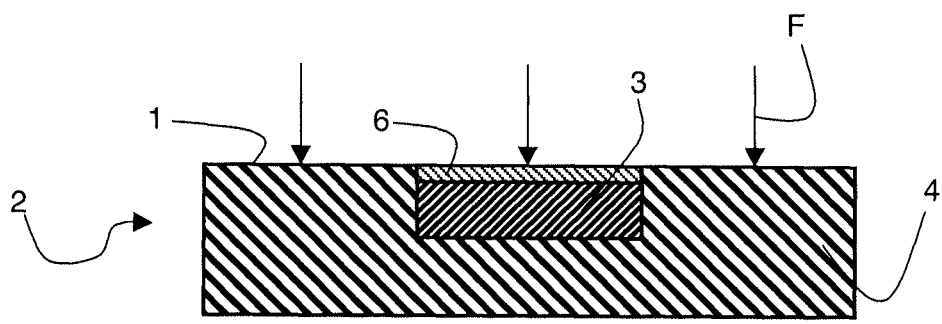
FIGS. 1 to 4 schematically illustrate in cross-section view different steps of particular embodiment for directly bonding two heterogeneous surfaces.

Each substrate 2 (or 2') advantageously is a substrate made of a semiconductor material, such as a silicon wafer. As illustrated in FIG. 1, it comprises a surface 1 or 1', advantageously planar, having at least one copper area 3 or 3' surrounded by a silicon area 4 or 4' formed therein.

Copper areas 3 and 3' of substrates 2 and 2' are more specifically intended to be placed in front of each other at the placing into contact, to obtain an electric contact.

Both substrates advantageously have at least one planar surface of low roughness. Planar surfaces 1 and 1' are intended to be arranged in front of each other and then bonded. However, it is also possible to have two surfaces 1 and 1' of complementary shapes, that is, capable of fitting together without deforming or with a slight deformation only at the placing into contact.

Figure 2:
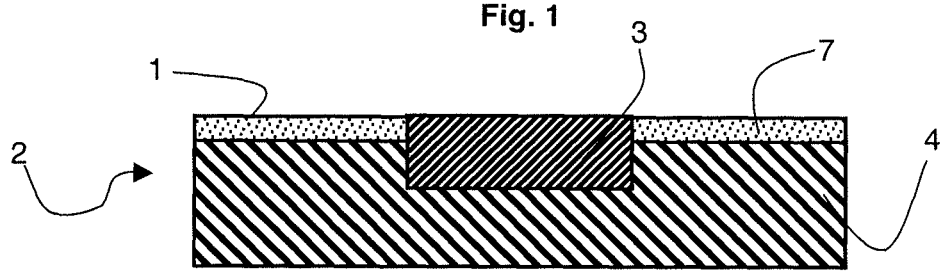
Figure 3:
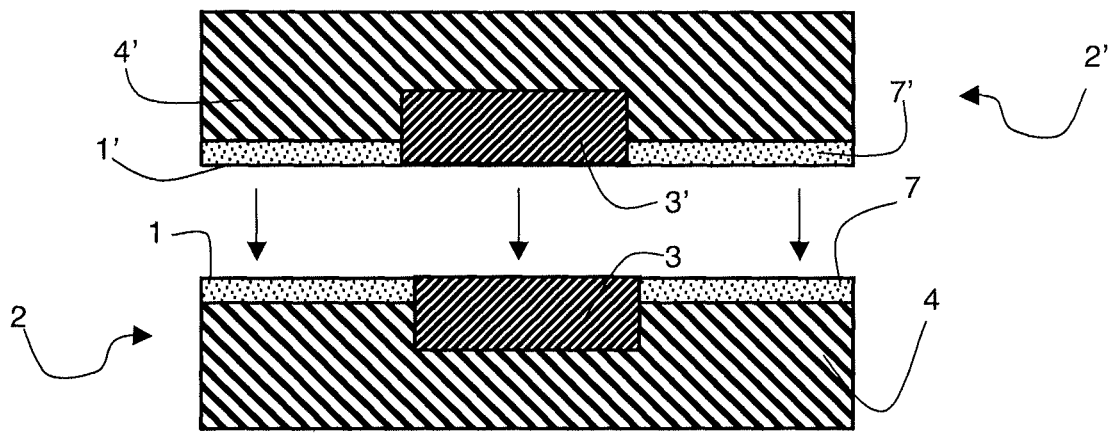
Figure 4:
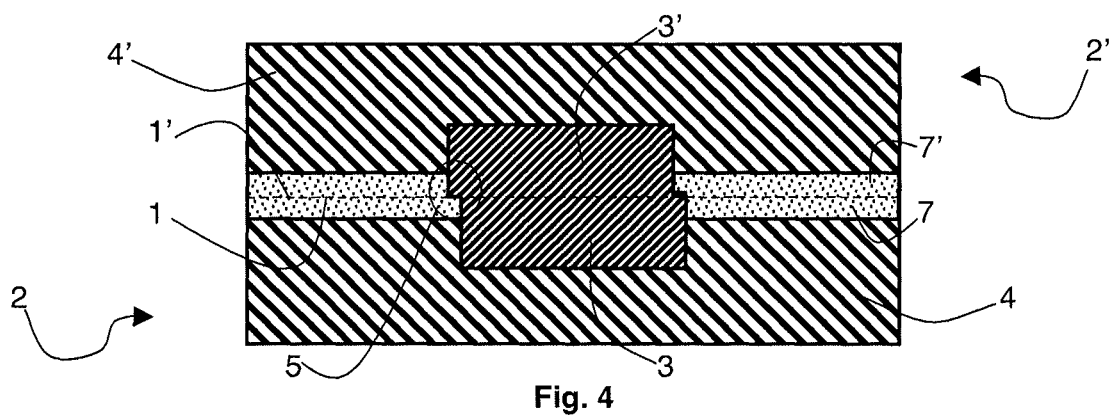

In particular, in the embodiment shown in FIGS. 1 to 4, copper areas 3 and 3' have substantially the same shape (rectangular cross-section) and the same dimensions and they are intended to be arranged in front of each other when surfaces 1 and 1' are placed into contact. Thus, as shown in FIG. 4, the major part of copper area 3 is in contact with the major part of copper area 3'. However, when the two surfaces are placed into contact, it is not possible to obtain a perfect alignment of copper areas 3 and 3': a slight shift 5 necessarily forms. It is generally caused by the etch patterns used to form areas 3 and 3', which do not enable to obtain perfectly identical and/or perfectly positioned copper areas 3 and 3'. Shift 5 generates, at the placing into contact, the creation of a Cu-oxide type interface in addition to the Cu-Cu and oxide-oxide interfaces, which respectively enable to form an electric contact and to achieve the bonding between substrates 2 and 2'.

Further, as illustrated in FIG. 1, before surfaces 1 and 1' are placed into contact, each copper area inherently comprises a thin copper oxide (CuO) superficial film 6, which may adversely affect the electric performance of the component which is desired to be obtained after bonding of the two surfaces.

A plasma treatment operation is carried out for each surface 1 and 1' (arrows F in FIG. 1) before surfaces 1 and 1' are placed into contact, to obtain, advantageously during a same treatment operation, not only a good bonding between surfaces but also a good electric performance. This is obtained by forming the plasma from a gas source containing a silicon oxide nitriding is agent and a copper oxide reducing agent containing hydrogen.

The gas source enabling to form the plasma may in particular comprise:
dinitrogen $N_2$ as a nitriding agent and ammonia $NH_3$ and/or dihydrogen $H_2$ as a copper oxide reducing agent, or
nitrous oxide $N_2O$ as a nitriding agent and dihydrogen $H_2$ as a copper oxide reducing agent, or
ammonia both playing the role of nitriding agent and of copper oxide reducing agent.

In a specific embodiment, the gas source is formed by a gas or a gas mixture forming the nitriding agent and the hydrogen based reducing agent. However, it may also, in other embodiments, comprise a neutral gas or several neutral gases, such as helium and/or argon, used as dilution gases.

Thus, the plasma obtained from this gas source necessarily comprises nitrogen and hydrogen.

As illustrated in FIG. 2, the nitrogen present in the plasma especially enables to form a thin surface film 7 at the level of the silicon oxide area, made of silicon oxynitride ($Si_xO_yN_z$ or nitrided silicon oxide). Thin surface film 7 then forms a barrier against the diffusion of copper in silicon oxide areas, vertically as well as horizontally in FIG. 4, while leaving surfaces 1 and 1' capable of being bonded. Further, the nitrogen present in the plasma does not alter the electric performance of copper areas 3 and 3'.

The hydrogen present in the plasma further enables to remove thin surface copper oxide film 6 or 6' present in copper area 3 or 3', thus improving the electric performance of the assembly once the bonding has been performed. Further, the hydrogen present in the plasma is inactive for silicon oxide.

FIGS. 3 and 4 illustrate the placing into contact of surfaces 1 and 1' enabling to obtain an electric contact between copper areas 3 and 3'. This placing into contact thus provides a heterogeneous interface between surfaces 1 and 1' (shown in dotted lines in FIG. 4). The heterogeneous interface is formed of at least three different portions:
a portion formed of an oxide-oxide interface obtained by the placing into contact of thin nitrided silicon oxide surface films 7 and 7',
a portion formed of a copper-copper interface obtained by the placing into contact of copper areas 3 and 3',
and a portion formed by a copper-oxide interface obtained by the placing into contact of a copper area 3 or 3' of a surface 1 or 1' with thin nitride silicon oxide surface film 7 or 7' of surface 1 or 1'.

If surfaces 1 and 1' are submitted to a previous surface activation operation by chemical-mechanical polishing (CMP), the surface treatment by plasma does not adversely affect this surface activation operation. If the surfaces are not previously activated by chemical-mechanical polishing, the nitrogen present in the plasma enables to activate the silicon oxide surface.

The bonding of two complementary surfaces having a small roughness, for example, two planar surfaces, enables to have an efficient direct bonding. The use of complementary surfaces enables to limit the deterioration of thin surface film 7 of the silicon oxide surfaces of surface 1 with areas protruding from surface 1', which enables to increase the active contact surface area for the direct bonding. The placing into contact is advantageously deprived of deformation aiming at driving the protruding pattern of one of the substrates into the other substrate to limit the pressure necessary for the placing into contact and to perform the direct bonding.

A subsequent annealing step may also be carried out after the placing into contact of surfaces 1 and 1', to obtain a recrystallization at the copper-copper interface and stabilize the copper. Such a step is advantageously carried out at a temperature ranging between the ambient temperature and 450° C.

As an example, the plasma treatment operation may be carried out in a single-wafer reactor (200 mm wafer) used to perform plasma-enhanced chemical vapor depositions (PECVD) having parallel plates, with a plasma discharge. The conditions in which the plasma treatment operation is performed are advantageously the following:
temperature in the reactor ranging between 150° C. and 450° C.,
pressure in the reactor ranging between 133.3 Pa (1 Torr) and 2,000 Pa (15 Torrs), RF power enabling to create the plasma ranging between 50 and 1,000 W, duration of the operation between 10 and 300 seconds, gas source with a variable flow rate and varying from 0 to 5,000 sccm for gases $NH_3$, $H_2$, $N_2$, $N_2O$ and He to obtain a plasma containing N and H.

The plasma surface treatment operation may also be carried out in a reactive ion etching (RIE) chamber. In this case, the conditions are identical to those mentioned hereabove, except for the temperature, which generally ranges between the ambient temperature and 150° C. and the pressure, which is generally smaller than 133.3 Pa (1 Torr).

In the same way, it may also be formed in an atmospheric plasma reactor. In this case, the surface plasma treatment operation is carried out at the atmospheric pressure, with a temperature that may range between the ambient temperature and 450° C.; the power, the duration and the gas flow rates being similar to those displayed hereabove.

Finally, the present invention is not limited to a method for bonding two mixed Cu-oxide surfaces together. Indeed, the plasma surface treatment operation described hereabove may also be applied to a single mixed Cu-oxide surface in the context of a direct bonding of said mixed Cu-oxide surface to another surface, such as a free surface of a continuous layer made of oxide (for example, silicon oxide), a metal (for example copper), or a semiconductor material (for example, silicon). The bonding occurs in the copper area and in the silicon oxide area. In this case, with the placing into contact of the two surfaces, the mixed Cu-oxide surface is submitted to the above-described surface plasma treatment operation while the other surface may be submitted to a preparation operation according to techniques conventional in the field of direct bonding (planarization, activation, etc.

The invention claimed is:

1. A method for bonding two surfaces comprising successively:

providing a first substrate having a first planar surface and a second substrate having a second planar surface, the first planar surface being provided with a first copper area surrounded by a first silicon oxide area, submitting the first planar surface to a plasma comprising a nitriding agent for nitriding silicon oxide, and a reducing agent comprising hydrogen for reducing copper oxide, the plasma simultaneously reducing a copper oxide layer of the first copper area and forming a silicon oxynitride layer over the first silicon oxide area, and contacting all of the first planar surface with all of the second planar surface for direct bonding of the first planar surface to the second planar surface at the interface between the first copper area and the second planar surface and at the interface between the silicon oxynitride layer and the second planar surface, wherein the second planar surface is provided with a second copper area surrounded by a second silicon oxide area, and wherein the second planar surface is submitted to a plasma comprising a nitriding agent for nitriding silicon oxide, and a reducing agent comprising hydrogen for reducing copper oxide before contacting the first planar surface with the second planar surface, the contacting the first planar surface with the second planar surface forms a planar and heterogeneous bonding interface comprising a copper-copper portion, a silicon oxynitride-silicon oxynitride portion, and a copper-silicon oxynitride portion, all of the copper-copper portion, silicon oxynitride-silicon oxynitride portion, and copper-silicon oxynitride portion of the bonding interface are planar and belong to the same plane of the bonding interface, the first copper area forms an electric contact with the second copper area, and the bonding between the first substrate and the second substrate is direct bonding performed at ambient pressure.

2. A method for bonding two surfaces comprising successively:

providing a first planar surface and a second planar surface, the first planar surface being provided with a first copper area covered by a copper oxide layer, the first copper area being surrounded by a first silicon oxide area, submitting the first planar surface to a plasma comprising hydrogen and nitrogen, the plasma simultaneously reducing the copper oxide layer of the first copper area and forming a first surface silicon oxynitride layer by nitridation of the first silicon oxide area, and contacting the first planar surface with the second planar surface for direct bonding of the first planar surface to the second planar surface at the interface between the first copper area and the second planar surface and at the interface between the first silicon oxide area and the second planar surface, the contacting the first planar surface with the second planar surface forming a planar and heterogeneous bonding interface comprising a copper-copper portion, a silicon oxynitride-silicon oxynitride portion, and a copper-silicon oxynitride portion, wherein the second planar surface is provided with a second copper area covered by a second copper oxide layer, the second copper area being surrounded by a second silicon oxide area, all of the copper-copper portion, silicon oxynitride-silicon oxynitride portion, and copper-silicon oxynitride portion of the bonding interface are planar and belong to the same plane of the bonding interface, the first copper area forms an electric contact with the second copper area, and the bonding between the first planar surface and the second planar surface is direct bonding performed at ambient pressure.

3. A method for bonding two surfaces comprising successively:

providing a first planar surface and a second planar surface, the first planar surface being provided with a first copper area covered by a copper oxide layer, the first copper area being surrounded by a first silicon oxide area, the second planar surface being provided with a second copper area covered by a second copper oxide layer, the second copper area being surrounded by a second silicon oxide area, submitting the first planar surface to a plasma comprising hydrogen and nitrogen, the plasma simultaneously reducing the copper oxide layer of the first copper area and forming a first surface silicon oxynitride layer by nitridation of the first silicon oxide area, submitting the second planar surface to a plasma comprising hydrogen and nitrogen, the plasma reducing the copper oxide layer of the second copper area and forming a second surface silicon oxynitride layer by nitridation of the second silicon oxide area, and contacting the first planar surface with the second planar surface for direct bonding of the first planar surface to the second planar surface at the interface between the first copper area and the second planar surface and at the interface between the first silicon oxide area and the second planar surface so as to form an electrically conducting contact at an interface between the first copper area and the second copper area, and to form an interface between the first surface silicon oxynitride layer and the second surface silicon oxynitride layer, wherein the bonding between the first planar surface and the second planar surface is direct bonding performed at ambient pressure.

4. A method for bonding two surfaces comprising successively:

providing a first substrate having a first planar outer face, the first planar outer face comprising a first copper area covered by a copper oxide layer and a first silicon oxide area surrounding the first copper area, the first copper area and the first silicon oxide area each having an outer face defining the first planar outer face of the first substrate and providing a second substrate having a second planar outer face, submitting the first planar outer face of the first substrate to a plasma comprising a nitriding agent for nitriding the first silicon oxide area to form a silicon oxynitride layer, and a reducing agent comprising hydrogen for reducing copper oxide, the plasma simultaneously reducing the copper oxide and nitriding the first silicon oxide area to form the silicon oxynitride layer, and contacting the first planar outer face of the first substrate with all of the second planar outer face for direct bonding of the first planar outer face to the second planar outer face at the interface between the first copper area and the second planar outer face and at the interface between the silicon oxynitride layer and the second planar outer face, wherein the first copper area forms an electric contact with the second substrate, the first planar outer face of the first substrate and the second planar outer face of the second surface form a planar interface comprising a copper-copper interface and a silicon oxynitride silicon oxynitride interface, and the bonding between the first substrate and the second substrate is direct bonding performed at ambient pressure.

5. The method of claim 4, wherein the nitriding agent is dinitrogen and wherein the reducing agent is selected from among ammonia, dihydrogen, and a mixture thereof.

6. The method of claim 4, wherein the nitriding agent is nitrous oxide and wherein the reducing agent is dihydrogen.

7. The method of claim 4, wherein the plasma comprises ammonia, and wherein the plasma has plasma conditions such that the ammonia simultaneously reduces the copper oxide layer of the first copper area to remove a surface copper film formed on the first copper area and forms the silicon oxynitride layer.

8. The method of claim 4, wherein the plasma comprises at least one neutral gas.

9. The method of claim 8, wherein the neutral gas is selected from among helium and argon.

10. The method of claim 4, wherein the submitting the first planar outer face to the plasma is preceded for the first planar outer face by a chemical-mechanical polishing operation.

11. The method of claim 4, wherein the second planar outer face is provided with a second copper area surrounded by a second silicon oxide area, and wherein the second planar outer face is submitted to a plasma comprising a nitriding agent for nitriding silicon oxide, and a reducing agent comprising hydrogen for reducing copper oxide before contacting the first planar outer face with the second planar surface.

12. The method of claim 11, wherein contacting the first planar outer face with the second planar outer face forms an interface between the first copper area and the second copper area, the contacting step being followed by an annealing to recrystallize copper at the interface between the first copper area and the second copper area.

13. The method of claim 11, wherein the contacting the first planar outer face with the second planar outer face forms a heterogeneous interface comprising a copper-copper portion, a silicon oxynitride-silicon oxynitride portion, and a copper-silicon oxynitride portion.

* * * * *